United States Patent
Schreiber et al.

(10) Patent No.: US 8,305,835 B2
(45) Date of Patent: Nov. 6, 2012

(54) MEMORY ELEMENTS HAVING CONFIGURABLE ACCESS DUTY CYCLES AND RELATED OPERATING METHODS

(75) Inventors: Russell Schreiber, Austin, TX (US); Martin Piorkowski, Austin, TX (US); Atif Habib, Folsom, CA (US); Peter Labrecque, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 147 days.

(21) Appl. No.: 12/968,074

(22) Filed: Dec. 14, 2010

(65) Prior Publication Data

US 2012/0147682 A1  Jun. 14, 2012

(51) Int. Cl.
*G11C 8/00* (2006.01)
*G11C 7/00* (2006.01)
(52) U.S. Cl. .................... 365/230.06; 365/191
(58) Field of Classification Search ........... 365/230.06
See application file for complete search history.

(56) References Cited

U.S. PATENT DOCUMENTS

| | | | | |
|---|---|---|---|---|
| 6,061,295 A * | 5/2000 | Roh | ........... | 365/230.03 |
| 6,449,200 B1 * | 9/2002 | Nelson et al. | ........... | 365/201 |
| 7,072,234 B1 * | 7/2006 | Nierle | ........... | 365/203 |
| 7,355,907 B2 * | 4/2008 | Chen et al. | ........... | 365/191 |
| 7,545,702 B2 * | 6/2009 | Kenkare et al. | ........... | 365/230.06 |
| 8,170,067 B2 * | 5/2012 | Zerbe et al. | ........... | 370/516 |

\* cited by examiner

*Primary Examiner* — Son Mai
(74) *Attorney, Agent, or Firm* — Ingrassia Fisher & Lorenz, P.C.

(57) ABSTRACT

Apparatus and methods are provided for accessing memory elements. An exemplary memory element includes an array of memory cells and a control module. Each memory cell of the array is coupled to an access line, wherein the control module is configured to assert a first signal for a write duty cycle on the access line to enable writing to a first memory cell of the array of memory cells, and the control module is configured to assert a second signal for a read duty cycle on the access line to enable reading from the first memory cell. The write duty cycle and the read duty cycle are each selected from a plurality of possible duty cycles. In an exemplary embodiment, the read duty cycle and the write duty cycle are chosen to optimize a performance parameter for the memory element.

20 Claims, 3 Drawing Sheets

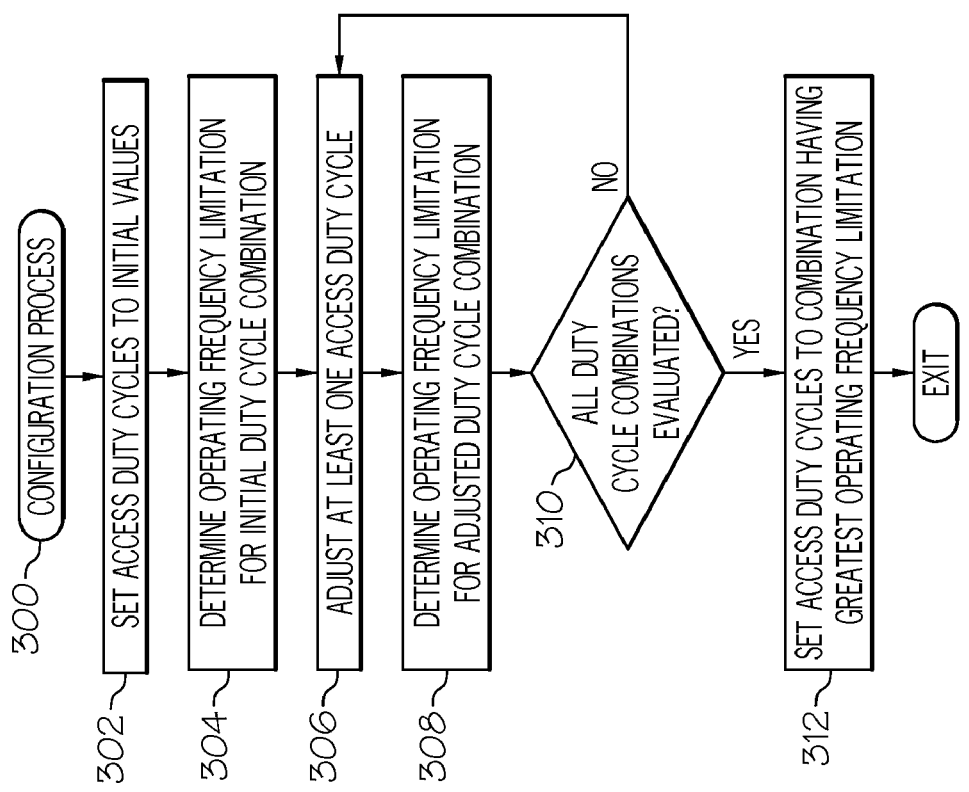

MEMORY ELEMENTS HAVING CONFIGURABLE ACCESS DUTY CYCLES AND RELATED OPERATING METHODS

TECHNICAL FIELD

Embodiments of the subject matter described herein relate generally to electronic circuits, and more particularly, relate to memory elements for use in computing devices and methods for configuring the same.

BACKGROUND

Memory elements are widely used in computing applications. For example, a typical computing device may include a combination of volatile and non-volatile memory elements to maintain data, program instructions, and the like that are accessed by a processing unit (e.g., a CPU) during operation of the computing device. Latencies associated with memory accesses impair performance of the computing device. Accordingly, it is desirable to increase the operating frequency of the memory elements to provide requested data or instructions to the processing unit with reduced latency.

BRIEF SUMMARY

In general, an apparatus for a memory element is provided. The memory element includes an array of memory cells and a control module. Each memory cell of the array is coupled to an access line. The control module is configured to assert a first signal on the first access line for a write duty cycle selected from a plurality of possible duty cycles to enable writing to a first memory cell of the array of memory cells. The control module is configured to assert a second signal on the first access line for a read duty cycle selected from the plurality of possible duty cycles to enable reading from the first memory cell.

In one embodiment, an apparatus for a computing module is provided. The computing module includes a memory element and a memory controller coupled to the memory element. The memory element includes an array of memory cells having one or more rows and a control module. Each memory cell of a first row of the one or more rows is coupled to a first access line. The control module is coupled to the first access line and configured to assert signals on the first access line to enable accessing a first memory cell of the first row. The memory controller configures the control module to assert a first signal on the first access line having a write duty cycle in response to a write instruction, and assert a second signal on the first access line having a read duty cycle in response to a read instruction, wherein the write duty cycle and the read duty cycle are different.

In another embodiment, a method is provided for accessing a first memory cell of a memory element. The method comprises the steps of asserting a first signal having a write duty cycle on an access line coupled to the first memory cell in response to a write instruction and asserting a second signal having a read duty cycle on the access line in response to a read instruction, wherein the write duty cycle and the read duty cycle are different. The first memory cell is coupled to a second access line while either the first signal or the second signal is asserted.

This summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 3 is a flow diagram of a configuration process suitable for use with the computing system of FIG. 1 or the cache memory element of FIG. 2 in accordance with one or more embodiments.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to memory elements for use in computing modules and related configuration methods that allow the memory element to operate at a higher frequency or otherwise attain greater frequency headroom between its current operating frequency setting and its maximum operating frequency. As described in greater detail below, the duty cycles (or access times) for writing data to and/or reading data from memory cells in the memory element are configurable, allowing the respective write and read duty cycles to be adjusted and set to optimal values that allow the memory element to achieve a greater maximum operating frequency. In one embodiment, the maximum operating frequency of the memory element is determined for each possible combination of write and read duty cycles, and the memory element is configured to implement the optimal combination of write and read duty cycles that provides the greatest maximum operating frequency. In this manner, the memory element may be operated at a greater frequency as compared to when the duty cycles are fixed at less optimal values, thereby reducing latencies or otherwise allowing the memory element to be operated with greater frequency headroom (i.e., the difference between the operating frequency setting being utilized and the maximum operating frequency) to avoid limiting the operating frequency of associated processing cores or other components used in conjunction with the memory element and achieve improved performance.

Figure 1:
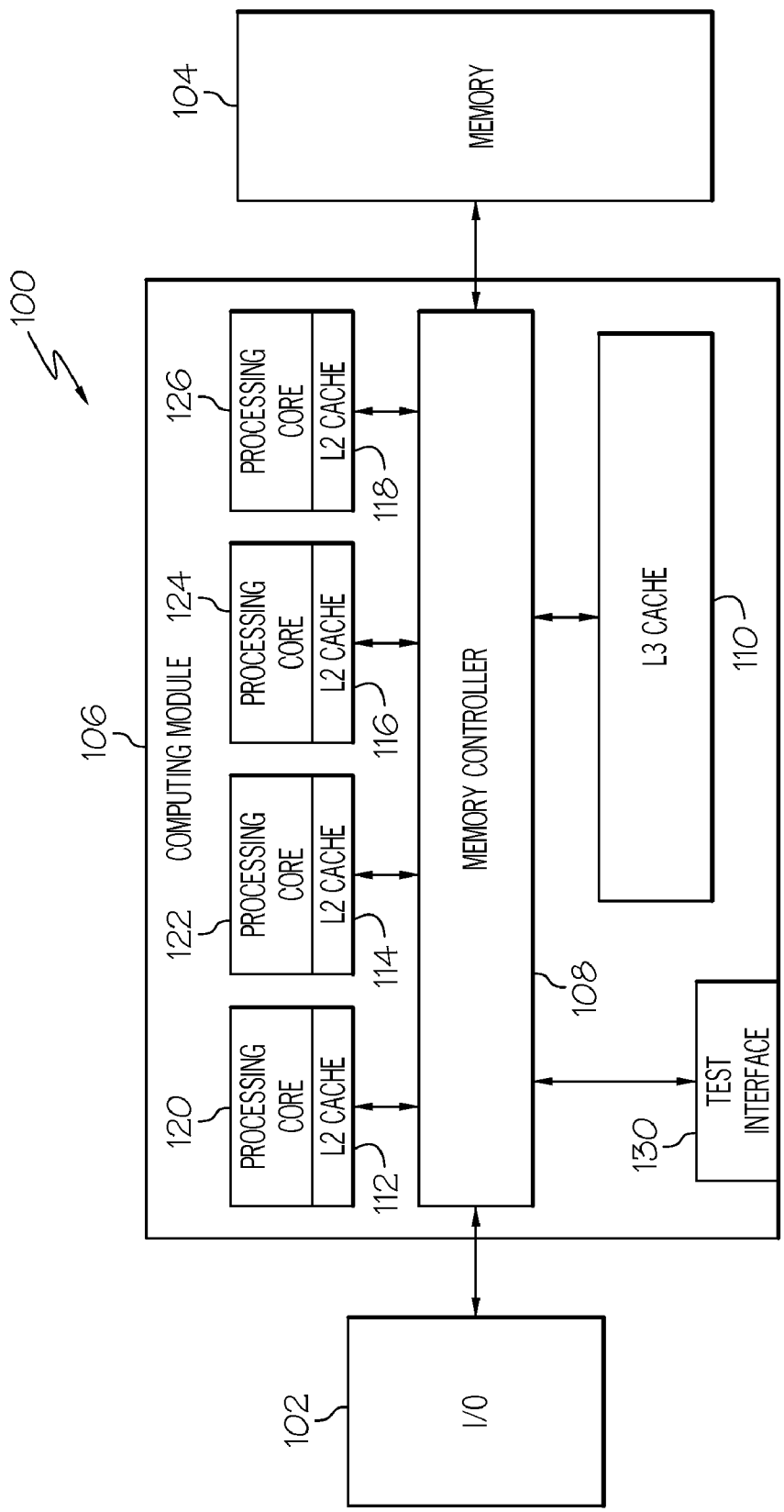
FIG. 1 is a block diagram of a computing system in accordance with one embodiment.

FIG. 1 depicts an exemplary embodiment of a computing system 100. The computing system 100 includes, without limitation, one or more input/output (I/O) peripherals 102, memory 104, and a computing module 106, such as a processor, central processing unit (CPU), graphics processing unit (GPU), or the like. In an exemplary embodiment, the computing module 106 includes a memory controller 108 (or northbridge) configured to interface with the I/O peripherals 102 and the memory 104, a plurality of cache memory elements (or caches) 110, 112, 114, 116, 118, a plurality of processing cores 120, 122, 124, 126, and a test interface 130. It should be understood that FIG. 1 is a simplified representation of a computing system 100 for purposes of explanation and ease of description, and FIG. 1 is not intended to limit the subject matter in any way. Practical embodiments of the computing system 100 may include other devices and components for providing additional functions and features, and/or the computing system 100 may be part of a larger system, as will be understood.

The I/O peripherals 102 generally represent the hardware, software, and/or firmware components configured to support communications to/from the computing module 106 and one or more peripheral (or external) devices. For example, the I/O peripheral 102 may be realized as a bus or another communications interface configured to support data transmission to/from the computing module 106 in accordance with one or more data communication protocols.

The memory 104 generally represents the main memory or primary memory for the computing system 100. Depending on the embodiment, memory 104 may be realized as a hard disk, flash memory, ROM memory, RAM memory, another suitable storage medium known in the art or any suitable combination thereof. The memory 104 maintains data and/or program instructions to support operations of the computing system 100 and/or computing module 106 as will be appreciated in the art. In an exemplary embodiment, memory 104 is implemented separately from computing module 106 (e.g., on another chip and/or die) may be understood as being external to computing module 106.

In an exemplary embodiment, the computing module 106 includes a memory controller 108 that is coupled to the I/O peripherals 102 and the external memory 104 and controls communications between the components of computing module 106 and the I/O peripherals 102 and/or external memory 104. The processing cores 120, 122, 124, 126 generally represent the main processing hardware, logic and/or circuitry for the computing module 106, and each processing core 120, 122, 124, 126 may be realized using one or more arithmetic logic units (ALUs), one or more floating point units (FPUs), one or more memory elements (e.g., one or more caches), discrete gate or transistor logic, discrete hardware components, or any combination thereof. Although not illustrated in FIG. 1, each processing core 120, 122, 124, 126 may implement its own associated cache memory element (e.g., a level one or L1 cache) in proximity to its respective processing circuitry for reduced latency.

In the illustrated embodiment, the caches 110, 112, 114, 116, 118 provide intermediary memory elements having reduced size relative to external memory 104 for temporarily storing data and/or instructions retrieved from external memory 104. In the illustrated embodiment, the computing module 106 includes a set of caches 112, 114, 116, 118 that are in close proximity to and coupled between a respective processing core 120, 122, 124, 126 and the memory controller 108. In this regard, caches 112, 114, 116, 118 may alternatively be referred to herein as core-coupled caches, and each core-coupled cache 112, 114, 116, 118 maintains data and/or program instructions previously fetched from external memory 104 that were either previously used by and/or are likely to be used by its associated processing core 120, 122, 124, 126. The caches 112, 114, 116, 118 are preferably larger than L1 caches implemented by the processing cores 120, 122, 124, 126 and function as level two caches (or L2 caches) in the memory hierarchy. The illustrated embodiment of computing module 106 also includes another higher level cache 110 (a level three or L3 cache) that is preferably larger than the L2 caches 112, 114, 116, 118.

In an exemplary embodiment, the computing module 106 includes a test interface 130 that comprises a plurality of pins dedicated for use in testing and/or configuring the functionality of the computing module 106. In one embodiment, the test interface 130 is compliant with the IEEE 1149.1 Standard Test Access Port and Boundary-Scan Architecture, that is, the Joint Test Action Group (JTAG) standards. The memory controller 108 is coupled to the test interface 130 and receives signals and/or bits from the test interface 130 that are indicative of a desired operating mode, and in response, the memory controller 108 implements the desired operating mode. In this regard, in an exemplary embodiment, the memory controller 108 initiates or otherwise implements a configuration process 300 as described in greater detail below in the context of FIG. 3 to configure the access duty cycles (or access times) for one or more memory elements 110, 112, 114, 116, 118 of the computing module 106. In this regard, in an exemplary embodiment, the memory controller 108 and the L2 caches 112, 114, 116, 118 are cooperatively configured to set the access duty cycles (or access times) for the L2 caches 112, 114, 116, 118 to an optimal combination of a write duty cycle and read duty cycle that provides the greatest maximum operating frequency for the respective L2 cache 112, 114, 116, 118. It should be noted that although the subject matter may be described herein in the context of the L2 caches 112, 114, 116, 118 for purposes of explanation, the subject matter is not intended to be limited to any particular memory element in the computing system 100 and may be implemented to configure the L3 cache 110, the external memory 104 or another memory element for an optimal combination of access duty cycles (or access times).

Figure 2:
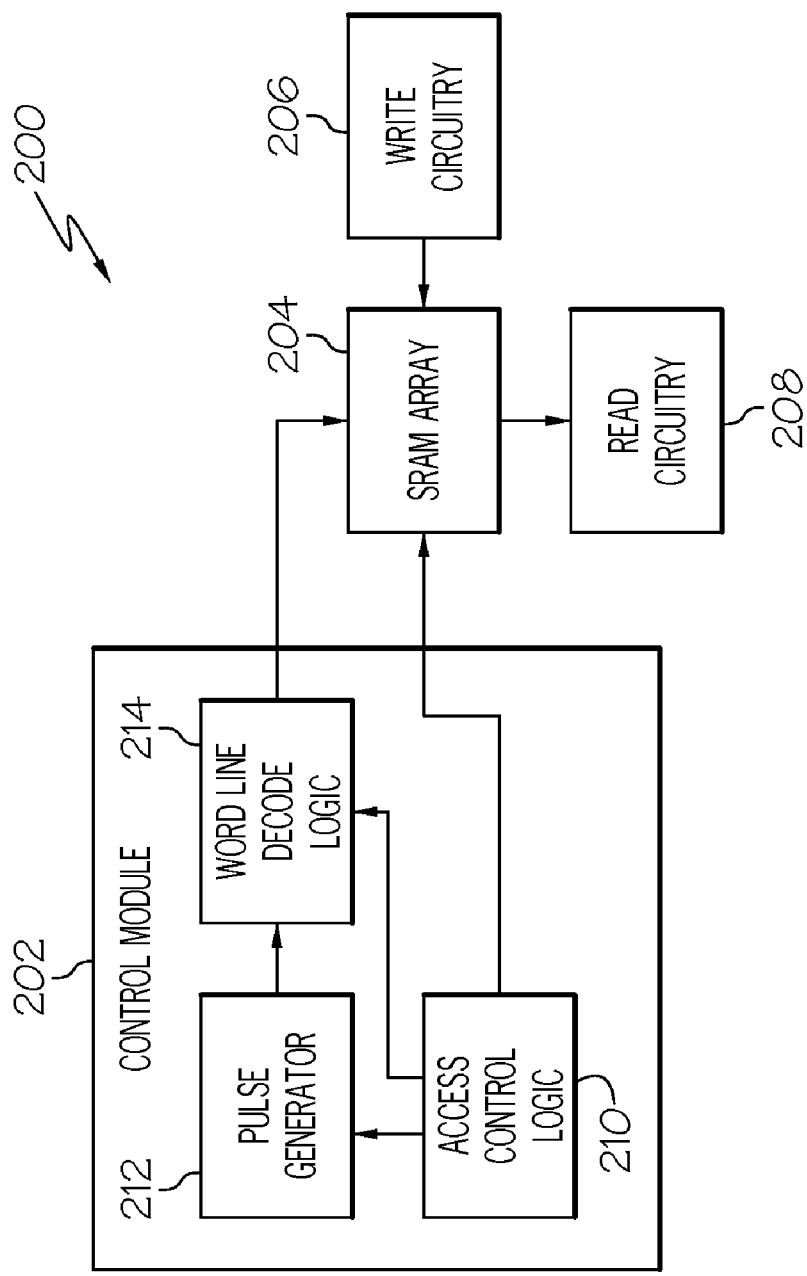
FIG. 2 is a block diagram of a memory element suitable for use in the system of FIG. 1 in accordance with one embodiment.

FIG. 2 depicts an exemplary embodiment of a memory element 200 suitable for use in the computing system 100 of FIG. 1. In this regard, in accordance with one or more embodiments, each of the L2 caches 112, 114, 116, 118 may be realized as an instance of memory element 200. The illustrated embodiment of the memory element 200 includes a control module 202, an array of memory cells 204, write circuitry 206, and read circuitry 208. In an exemplary embodiment, the memory cells are realized as static random access memory (SRAM) cells. Accordingly, for convenience, but without limitation, the array of memory cells 204 may alternatively be referred to herein as an array of SRAM cells or an SRAM array. It should be understood that FIG. 2 is a simplified representation of a memory element 200 for purposes of explanation and ease of description, and FIG. 2 is not intended to limit the subject matter in any way. In this regard, practical embodiments of the memory element 200 may utilize other suitable memory cells (e.g., dynamic random access memory (DRAM) cells) or include other devices and components for providing additional functions and features, as will be understood.

In an exemplary embodiment, the SRAM array 204 is realized as a two-dimensional rectangular array having a first number (n) of columns of memory cells by a second number (m) of rows of memory cells. Each memory cell within an individual row is coupled to a first set of one or more access lines (alternatively referred to herein as word lines), and each memory cell within an individual column is coupled to a second set of one or more access lines (alternatively referred to herein as bit lines). In this regard, signals on the word line(s) for each respective row control or otherwise enable access to the memory cells of that respective row coupled to that respective word line, while the bit lines are coupled to the access circuitry 206, 208 to control or otherwise enable data to be written to and/or read from an addressed memory cell in that respective row of memory cells. In an exemplary embodiment, each memory cell within an individual row includes one or more access transistors coupled to a word line associated with that respective row, wherein when a logical high word line select signal is asserted or otherwise provided on that respective word line, the memory cells of that row are coupled to their corresponding bit line(s) to enable access to the memory cells of that row. As described in greater detail below, the control module 202 is configured to assert or otherwise provide a word line select signal associated with an addressed row of the SRAM array 204 with a particular duty cycle (or duration) to enable access to an SRAM cell in that row of the array 204. In an exemplary embodiment, the duty cycle (or duration) of the word line select signal is configurable and/or adjustable, such that the control module 202 may implement an optimal duty cycle combination for accessing the memory cells of the SRAM array 204. As described in greater detail below, in an exemplary embodiment, the control module 202 is configured such that in response to receiving a read instruction, the control module 202 asserts a word line select signal for the addressed row with an optimal read duty cycle, and in response to receiving a write instruction, the control module 202 asserts the word line select signal for the addressed row with an optimal write duty cycle. The optimal read duty cycle and the optimal write duty cycle are chosen to allow the memory element 200 to achieve the greatest maximum operating frequency, thereby reducing latency or providing greater frequency headroom when operating the memory element 200.

In an exemplary embodiment, the SRAM array 204 includes column select circuitry configured to select or otherwise enable access to (e.g., writing to and/or reading from) a particular column of cells within the SRAM array 204 by coupling the bit line(s) of a selected column to the access circuitry 206, 208 in response to signals from the control module 202. While the control module 202 asserts a word line select signal for a particular row of the SRAM array 204 that includes an addressed SRAM cell (e.g., the SRAM cell to be accessed), the control module 202 provides signals to or otherwise operates the column select circuitry to couple the bit line(s) associated with the addressed SRAM cell to the access circuitry 206, 208, thereby enabling access to (e.g., writing to and/or reading from) the bit line(s) of the addressed SRAM cell while the word line select signal is asserted. In this regard, the write circuitry 206 generally represents the circuitry, logic, and/or hardware components (e.g., write drivers and the like) configured to write data to the bit line(s) coupled to the write circuitry 206 via the column select circuitry while the word line select signal is asserted to write data to an addressed SRAM cell within the SRAM array 204 (e.g., the SRAM cell that is in both the addressed row and the selected column) The read circuitry 208 generally represents the circuitry, logic, and/or hardware components (e.g., sense amplifiers and the like) configured to read data from bit line(s) coupled to the read circuitry 208 via the column select circuitry to read data from an addressed SRAM cell within the SRAM array 204.

In an exemplary embodiment, the control module 202 includes access control logic 210, a configurable pulse generator 212, and word line decode logic 214. The access control logic 210 is coupled to the configurable pulse generator 212, and the word line decode logic 214 is coupled between the output of the configurable pulse generator 212 and the SRAM array 204 such that the output of the configurable pulse generator 212 is coupled to an addressed (or selected) word line of the SRAM array 204 via the word line decode logic 214. The access control logic 210 generally represents the circuitry, logic, and/or hardware components configured to receive write and/or read instructions and associated addressing information indicative of a particular SRAM cell in the SRAM array 204 to be written to and/or read from. The access control logic 210 decodes the addressing information into a particular row and column of the SRAM array 204 to be selected. The access control logic 210 is coupled to the word line decode logic 214 and provide signals or otherwise instructs the word line decode logic 214 to couple the word line associated with the addressed SRAM cell indicated by the received addressing information to the output of the configurable pulse generator 212. In this regard, the word line decode logic 214 represents the circuitry, logic, and/or hardware components coupled to the output of the configurable pulse generator 212 that is configured to provide an output pulse generated by the configurable pulse generator 212 to the word line coupled to the addressed row of SRAM cells in the SRAM array 204, that is, the word line coupled to the addressed SRAM cell. The access control logic 210 concurrently asserts or otherwise provides a column select signal to the column select circuitry of the SRAM array 204 to couple the bit line(s) associated with the addressed SRAM cell to the appropriate access circuitry 206, 208, thereby enabling access to the addressed SRAM cell.

In an exemplary embodiment, the configurable pulse generator 212 generally represents the circuitry, logic, and/or hardware components configured to generate output pulses having a particular access duty cycle (or duration) at a particular operating frequency. In this regard, the access duty cycle represents a fraction or percentage of an access cycle (e.g., the inverse of the operating frequency of the memory element 200) that an output pulse generated by the configurable pulse generator 212 is in an asserted (or logical high) state. In an exemplary embodiment, the configurable pulse generator 212 is configured to provide variable duty cycles at fixed increments between a lower duty cycle limit and an upper duty cycle limit. For example, the configurable pulse generator 212 may be configured to provide duty cycles between forty percent and sixty percent at ten percent intervals, resulting in three possible duty cycle settings. In an exemplary embodiment, the access control logic 210 instructs or otherwise signals the configurable pulse generator 212 to generate output pulses with a particular write duty cycle in response to receiving a write instruction, and the access control logic 210 instructs or otherwise signals the configurable pulse generator 212 to generate output pulses with a particular read duty cycle in response to receiving a read instruction. As set forth above and described in greater detail below, the access control logic 210 instructs or otherwise signals the configurable pulse generator 212 to generate output pulses with an optimal write duty cycle in response to write instructions and an optimal read duty cycle in response to read instructions to implement an optimal combination of write and read duty cycle that allows the memory element 200 to achieve the greatest maximum operating frequency.

In an exemplary embodiment, the duration of the output pulses generated or otherwise provided by the configurable pulse generator 212 correspond to the duty cycle setting multiplied by the inverse of the operating frequency of the configurable pulse generator 212, wherein the operating frequency of the configurable pulse generator 212 is also configurable and/or adjustable in response to instructions and/or signals from the memory controller 108 and/or access control logic 210. For example, the configurable pulse generator 212 may be capable of operating at various frequencies at fixed increments between a lower operating frequency limit and an upper operating frequency limit. In some embodiments, the access control logic 210 instructs the configurable pulse generator 212 or otherwise sets or controls the operating frequency setting of the configurable pulse generator 212 such that the configurable pulse generator 212 generates output pulses based on a desired operating frequency. In accordance with one embodiment, the access control logic 210 instructs the configurable pulse generator 212 or otherwise sets the operating frequency of the configurable pulse generator 212 to the maximum operating frequency for the optimal access duty cycle combination.

Referring now to FIG. 3, in an exemplary embodiment, a computing module 106 may be configured to perform a configuration process 300 and additional tasks, functions, and/or operations as described below. The various tasks may be performed by software, hardware, firmware, or any combination thereof. For illustrative purposes, the following description may refer to elements mentioned above in connection with FIGS. 1-2. In practice, the tasks, functions, and operations may be performed by different elements of the described system, such as the memory controller 108, memory elements 104, 110, 112, 114, 116, 118, 200, control module 202, access control logic 210, configurable pulse generator 212, and/or word line decode logic 214. It should be appreciated any number of additional or alternative tasks may be included, and may be incorporated into a more comprehensive procedure or process having additional functionality not described in detail herein.

Referring to FIG. 3, and with continued reference to FIGS. 1-2, the configuration process 300 may be performed to enable the computing module 106 to configure the duty cycles and/or times for accessing locations within the cache memory elements 110, 112, 114, 116, 118 as part of a particular configuration or test procedure (e.g., a built-in self test) to achieve higher operating frequencies or greater frequency headroom for the cache memory elements 110, 112, 114, 116, 118. In an exemplary embodiment, the configuration process 300 initializes or otherwise begins in response to receiving or otherwise identifying signals and/or bits at the test interface 130 indicative of or otherwise identifying a desire to enter an operating mode to configure the access duty cycles and/or times for one or more of the caches 110, 112, 114, 116, 118. In response to identifying the operating mode corresponding to the configuration process 300 based on the inputs at the test interface 130, the memory controller 108 provides instructions or otherwise signals the appropriate cache 110, 112, 114, 116, 118 to implement the configuration process 300 as described in greater detail below.

In an exemplary embodiment, the configuration process 300 begins by setting the access duty cycles of the memory element being configured to initial or default values (task 302). For example, the memory controller 108 may provides instructions or otherwise signal the access control logic 210 and/or control module 202 of a respective cache memory element 110, 112, 114, 116, 118 for an initial (or default) write duty cycle and an initial (or default) read duty cycle. For example, the memory controller 108 may initialize a respective memory element 200 by signaling the access control logic 210 and/or control module 202 for an initial write duty cycle ($d_W$) of fifty percent (e.g., $d_W=0.5$) and an initial read duty cycle ($d_R$) of fifty percent (e.g., $d_R=0.5$).

After setting the initial access duty cycles, the configuration process 300 continues by determining an operating frequency limitation for the memory element when the initial combination of access duty cycles is implemented, that is, the maximum operating frequency of the memory element for the initial access duty cycle combination (task 304). As used herein, the maximum operating frequency of a memory element should be understood as referring to the maximum frequency that the memory element can be operated at for a particular fixed set of parameters (e.g., operating voltage, operating temperature, and the like). In an exemplary embodiment, the memory controller 108 and/or control module 202 performs a built-in self test or another test procedure to test the writeability and/or readability of the SRAM array 204 in the respective memory element 200 while maintaining the write and read duty cycles constant at their previously set values and adjusting the operating frequency of configurable pulse generator 212 that is used to generate the output pulses.

For example, in accordance with one or more embodiments, the memory controller 108 and/or access control logic 210 may signal, instruct, or otherwise configure the configurable pulse generator 212 to generate pulses with an initial operating frequency (e.g., the lowest possible operating frequency for the pulse generator). The memory controller 108 provides write instructions with corresponding addressing information to the access control logic 210 and/or control module 202 while providing corresponding test data to be written to the input of the write circuitry 206. The access control logic 210 and/or word line decode logic 214 assert or otherwise provide appropriate word line select and column select signals to enable writing the data provided by the memory controller 108 to addressed SRAM cells in the SRAM array 204. In this regard, while writing data to the SRAM array 204, the word line select signals provided or otherwise asserted by the control module 202 have a duration corresponding to the initial write duty cycle multiplied by the inverse of the initial frequency (e.g., $t_W=d_W \times t_f$, where $t_W$ is the duration of the word line select signal, $d_W$ is the write duty cycle, and $t_f$ is the inverse of the operating frequency of the configurable pulse generator 212). While the appropriate word line select signal is asserted for that duration, the SRAM cells of that row of the SRAM array 204 are coupled to their corresponding bit line(s) that are configured to receive the data to be written from write circuitry 206 via column select circuitry. The column select signals provided by the access control logic 210 operate the column select circuitry to couple bit line(s) of the addressed SRAM cell to the output of the write circuitry 206 to write data to the addressed SRAM cell while the word line select signal is asserted, resulting in the data being stored or otherwise maintained by the addressed SRAM cell. It will be appreciated the art that in some practical embodiments, when the word line select signals are unasserted (e.g., for a duration of time corresponding to the inverse of the operating frequency of the configurable pulse generator 212 minus the duration of the word line select signal pulse generated by the configurable pulse generator 212), the bit line(s) of the SRAM array 204 may be precharged to desired voltage and/or logic levels.

After writing data to the SRAM array 204, the memory controller 108 provides read instructions with corresponding addressing information to the access control logic 210 and/or control module 202, and in response, the access control logic 210 and/or word line decode logic 214 assert or otherwise provide appropriate word line select and column select signals to enable reading data from addressed SRAM cells in the SRAM array 204 back to the memory controller 108 via the read circuitry 208. While reading data from the SRAM array 204, the word line select signals provided or otherwise asserted by the control module 202 have a duration corresponding to the initial read duty cycle multiplied by the inverse of the initial frequency (e.g., $t_R=d_R \times t_f$, where $t_R$ is the duration of the word line select signal while reading data and $d_R$ is the write duty cycle). While the appropriate word line select signal is asserted for that duration, the SRAM cells of that row of the SRAM array 204 are coupled to their corresponding bit line(s) to provide the stored data maintained by the SRAM cells of that row to their respective bit line(s). The column select signals provided by the access control logic 210 operate the column select circuitry to couple bit line(s) of the addressed SRAM cell to the output of the read circuitry 208 to read data stored and/or maintained by the addressed SRAM cell to the memory controller 108 while the word line select signal is asserted. If the data read from the SRAM array 204 matches the data written to the SRAM array 204, the memory controller 108 and/or control module 202 increases the operating frequency of the configurable pulse generator 212 and repeats the steps of writing and reading data until the data read from the SRAM array 204 does not match the data written to the SRAM array 204. The memory controller 108 and/or control module 202 determines or otherwise identifies the maximum operating frequency for the initial combination of duty cycle values as the highest operating frequency for the configurable pulse generator 212 that resulted in the data read from the SRAM array 204 matching the data written to the SRAM array 204. The memory controller 108 and/or control module 202 stores or otherwise maintains the association between the maximum operating frequency and the initial combination of write and read duty cycles.

After determining the maximum operating frequency for the initial combination of access duty cycles, the configuration process 300 continues by adjusting at least one of the access duty cycles (task 306). In this regard, the memory controller 108 signals the access control logic 210 to implement a different combination of write duty cycle and read duty cycle, for example, by increasing and/or decreasing the write duty cycle and/or read duty cycle from their initial values. For example, the memory controller 108 may instruct or otherwise signal the access control logic 210 and/or control module 202 for a write duty cycle ($d_W$) of forty percent (e.g., $d_W$=0.4) and a read duty cycle ($d_R$) of fifty percent.

In an exemplary embodiment, after adjusting at least one of the access duty cycles, the configuration process 300 continues by determining the maximum operating frequency for the memory element for the current combination of access duty cycles (task 308). As described above, the memory controller 108 and/or control module 202 may perform a built-in self test or another test procedure to test the writeability and/or readability of the SRAM array 204 in the respective memory element 200 by adjusting the operating frequency of the configurable pulse generator 212 while implementing the current combination of write and read duty cycles. For example, in this regard, while writing data to the SRAM array 204, the word line select signals provided or otherwise asserted by the control module 202 have a duration corresponding to the forty percent write duty cycle multiplied by the inverse of the operating frequency of the configurable pulse generator 212, while word line select signals provided or otherwise asserted by the control module 202 when reading data from the SRAM array 204 have a duration corresponding to the fifty percent read duty cycle multiplied by the inverse of the operating frequency of the configurable pulse generator 212. As described above, when the data read from the SRAM array 204 matches the data written to the SRAM array 204, the memory controller 108 and/or control module 202 increases the operating frequency of the configurable pulse generator 212 until the data read from the SRAM array 204 does not match the data written to the SRAM array 204. The memory controller 108 and/or control module 202 determines or otherwise identifies the maximum operating frequency for the current combination of duty cycle values and stores or otherwise maintains the association between the optimal operating frequency and the current combination of write and read duty cycle values, in a similar manner as set forth above.

In an exemplary embodiment, the configuration process 300 continues by determining whether all possible combinations of write and read duty cycles have been evaluated, that is, whether a maximum operating frequency has been determined for each possible combination of write duty cycle and read duty cycle capable of being implemented by the pulse generator (task 310). For example, if the configurable pulse generator 212 is capable of providing variable duty cycles between forty percent and sixty percent at ten percent intervals, there are nine possible combinations of write and read duty cycles. In this regard, the configuration process 300 repeats the loop defined by tasks 306, 308, and 310 until a maximum operating frequency has been determined for each possible combination of write and read duty cycle. For example, after signaling the access control logic 210 and/or control module 202 for a write duty cycle ($d_W$) of forty percent $d_W$=0.4) and a read duty cycle ($d_R$) of fifty percent, the memory controller 108 may signal the access control logic 210 and/or control module 202 for a write duty cycle of forty percent (e.g., $d_W$=0.4) and a read duty cycle ($d_R$) of forty percent (e.g., $d_R$=0.4), determine the maximum operating frequency for the combination of a write duty cycle of forty percent and a read duty cycle ($d_R$) of forty percent, and store or otherwise maintain the association between the maximum operating frequency and the combination of a write duty cycle of forty percent and a read duty cycle ($d_R$) of forty percent in a similar manner as described above (e.g., tasks 306, 308). After determining optimal operating frequencies for the combination of a forty percent write duty cycle and a forty percent read duty cycle ($d_R$), the configuration process 300 repeats until determining the maximum operating frequency for each of the possible combinations of write and read duty cycles. In this regard, in some embodiments, the signals and/or bits received from the test interface 130 may indicate the combination of access duty cycles to be implemented for determining the maximum operating frequency, wherein the signals and/or bits at the test interface 130 sequentially progress through their range of possible input values to determine the maximum operating frequency for each possible combination of signals and/or bits at the test interface 130.

After determining optimal operating frequencies for each possible combination of write and read duty cycle values, the configuration process 300 continues by configuring the memory element for the optimal duty cycle combination, that is, the combination of access duty cycles having the greatest maximum operating frequency (task 312). In an exemplary embodiment, the memory controller 108 determines or otherwise identifies the greatest maximum operating frequency among the maximum operating frequencies for all of the possible combinations of write and read duty cycles, and then identifies the combination of write duty cycle and read duty cycle that resulted in that greatest maximum operating frequency. In response to identifying the duty cycle combination having the greatest maximum operating frequency, the memory controller 108 instructs or otherwise signals the control module 202 and/or access control logic 210 to implement that combination of access duty cycles throughout operation of the memory element 200 and/or computing module 106. For example, if a write duty cycle of forty percent and a read duty cycle of sixty percent provides the greatest maximum operating frequency, the memory controller 108 instructs or otherwise signals the control module 202 and/or access control logic 210 such that during operation of the memory element 200, in response to write instructions, the access control logic 210 instructs or otherwise signals the configurable pulse generator 212 to generate output pulses with a duty cycle of forty percent to write data to the SRAM array 204, and in response to read instructions, the access control logic 210 instructs or otherwise signals the configurable pulse generator 212 to generate pulses with a duty cycle of sixty percent to read data to the SRAM array 204. In this manner, to write data, the control module 202 asserts word line select signals for an optimal write duty cycle selected from the plurality of possible duty cycles capable of being generated by the pulse generator 212, and to read data, the control module 202 asserts word line select signals for an optimal read duty cycle selected from the plurality of possible duty cycles capable of being generated by the pulse generator 212. In some embodiments, the memory controller 108 may also instruct or otherwise signal the control module 202 and/or configurable pulse generator 212 such that during operation of the memory element 200, the configurable pulse generator 212 generates pulses with the previously maximum operating frequency for optimal combination of write and read duty cycles being implemented.

To briefly summarize, one advantage of the apparatus and/or methods described above is that a memory element may be configured for optimal access duty cycles (or access times), thereby allowing the memory element to achieve a greater operating frequency and/or greater frequency headroom and improved performance. In this manner, the write duty cycle and read duty cycle may be configured to provide an optimal tradeoff between the amount of time that the word line signals are asserted and the SRAM cells are capable of being accessed and the amount of time that the word line signals are not asserted (i.e., the amount of time available for the bit line(s) to be precharged). For example, in some small-swing SRAM sensing schemes, the amount of time required to precharge the bit lines to the desired voltage level after write operations is greater than the amount of time required to precharge the bit lines after read operations. Thus, the write duty cycle may be set to be a value that is less than the read duty cycle to provide more precharge time during the write operation cycle. As a result, the precharge time after performing a write operation may be less restrictive SRAM and allow for a greater maximum operating frequency for the memory element than if the write duty cycle and read duty cycle were the same value. In other embodiments, the write duty cycle and read duty cycle values may be optimized for other performance parameters, for example, the provide the best minimum operating voltage for the memory element at a particular operating frequency. Additionally, the write duty cycle and read duty cycle values may be adjusted to debug or test a particular memory element to determine whether the write duty cycle or the read duty cycle is limiting one or more performance parameters (e.g., maximum operating frequency, minimum operating voltage, or the like) if that memory element is unable to achieve a particular performance target (e.g., a desired maximum operating frequency, a desired minimum operating voltage, or the like).

For the sake of brevity, conventional techniques related to integrated circuit design, caching, memory operations, memory controllers, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A memory element comprising:
an array of memory cells, each memory cell of the array being coupled to a first access line; and
a control module coupled to the first access line, wherein the control module is configured to:
assert a first signal on the first access line for a write duty cycle selected from a plurality of possible duty cycles to enable writing to a first memory cell of the array of memory cells; and
assert a second signal on the first access line for a read duty cycle selected from the plurality of possible duty cycles to enable reading from the first memory cell.

2. The memory element of claim 1, wherein the write duty cycle and the read duty cycle are different.

3. The memory element of claim 1, wherein the control module is configured to select an optimal write duty cycle from the plurality of possible duty cycles as the write duty cycle and an optimal read duty cycle from the plurality of possible duty cycles as the read duty cycle, the optimal write duty cycle and the optimal read duty cycle being selected to maximize an operating frequency of the memory element.

4. The memory element of claim 3, wherein:
asserting the first signal results in the first memory cell being coupled to a second access line for a first duration of time, the first duration being influenced by the write duty cycle and the operating frequency of the memory element; and asserting the second signal results in the first memory cell being coupled to the second access line for a second duration of time, the second duration being influenced by the read duty cycle and the operating frequency.

5. The memory element of claim 1, wherein the control module is configured to select an optimal write duty cycle from the plurality of possible duty cycles as the write duty cycle and an optimal read duty cycle from the plurality of possible duty cycles as the read duty cycle, the optimal write duty cycle and the optimal read duty cycle being selected to minimize an operating voltage of the memory element.

6. The memory element of claim 1, wherein asserting the first signal results in the first memory cell being coupled to a second access line, the second access line being configured to receive first data to be written to the first memory cell while the first signal is asserted.

7. The memory element of claim 1, wherein asserting the second signal results in the first memory cell being coupled to a second access line, resulting in stored data maintained by the first memory cell being provided to the second access line while the second signal is asserted.

8. The memory element of claim 1, wherein:
asserting the first signal results in the first memory cell being coupled to a second access line for a first duration of time, the first duration being influenced by the write duty cycle and an operating frequency of the memory element;
asserting the second signal results in the first memory cell being coupled to the second access line for a second duration of time, the second duration being influenced by the read duty cycle and the operating frequency; and
the second duration is greater than the first duration.

9. The memory element of claim 1, wherein the control module includes:
a pulse generator coupled to the first access line, the pulse generator being configured to generate output pulses on the first access line having a duty cycle of the plurality of possible duty cycles; and
control logic coupled to the pulse generator, wherein the control logic is configured to:
instruct the pulse generator to generate a first output pulse having the write duty cycle in response to receiving a write instruction; and
instruct the pulse generator to generate a second output pulse having the read duty cycle in response to receiving a read instruction.

10. The memory element of claim 9, wherein:
the first output pulse couples the first memory cell to a second access line, the second access line being configured to receive data to be written to the first memory cell while the first output pulse is asserted; and
the second output pulse couples the first memory cell to the second access line, resulting in stored data maintained by the first memory cell being provided to the second access line while the second output pulse is asserted.

11. The memory element of claim 9, wherein:
the pulse generator is configured to generate the output pulses on the first access line with a frequency corresponding to a maximum operating frequency associated with a combination of the write duty cycle and the read duty cycle;
the first output pulse results in the first memory cell being coupled to a second access line for a first duration of time corresponding to a product of the write duty cycle and an inverse of the maximum operating frequency; and
the second output pulse results in the first memory cell being coupled to the second access line for a second duration of time corresponding to a product of the read duty cycle and the inverse of the maximum operating frequency.

12. A computing module comprising:
a memory element including:
an array of memory cells having one or more rows, each memory cell of a first row of the one or more rows being coupled to a first access line; and
a control module coupled to the first access line, the control module being configured to assert signals on the first access line to enable accessing a first memory cell of the first row;
a memory controller coupled to the memory element, wherein the memory controller is configured to:
configure the control module to assert a first signal on the first access line having a write duty cycle in response to a write instruction; and
configure the control module to assert a second signal on the first access line having a read duty cycle in response to a read instruction, wherein the write duty cycle and the read duty cycle are different.

13. The computing module of claim 12, wherein the memory controller is configured to identify an optimal duty cycle combination for operating the memory element, the optimal duty cycle combination comprising the write duty cycle and the read duty cycle.

14. The computing module of claim 13, wherein the memory controller is configured to:
identify a maximum frequency for the optimal duty cycle combination; and
configure the control module for the maximum frequency, wherein:
the control module asserts the first signal for a first duration corresponding to the write duty cycle multiplied by an inverse of the maximum frequency; and
the control module asserts the second signal for a second duration corresponding to the read duty cycle multiplied by the inverse of the maximum frequency.

15. The computing module of claim 14, wherein the control module comprises:
a pulse generator coupled to the first access line, the pulse generator being configured to generate output pulses on the first access line with the maximum frequency; and
control logic coupled to the pulse generator, wherein the control logic is configured to:
instruct the pulse generator to generate a first output pulse having the first duration on the first access line in response to receiving the write instruction; and
instruct the pulse generator to generate a second output pulse having the second duration on the first access line in response to receiving the read instruction.

16. The computing module of claim 12, wherein the control module comprises:
a pulse generator coupled to the first access line, the pulse generator being configured to generate output pulses on the first access line; and
control logic coupled to the pulse generator, wherein the control logic is configured to:
instruct the pulse generator to generate a first output pulse on the first access line in response to receiving the write instruction, the first output pulse having a first duration of time influenced by the write duty cycle and an operating frequency for the memory element; and
instruct the pulse generator to generate a second output pulse on the first access line in response to receiving the read instruction, the second output pulse having a second duration of time influenced by the read duty cycle and the operating frequency, the second duration being different than the first duration.

17. A method for accessing a first memory cell of a memory element, the method comprising:
    asserting a first signal having a write duty cycle on an access line coupled to the first memory cell in response to a write instruction; and
    asserting a second signal having a read duty cycle on the access line in response to a read instruction, wherein:
        the first memory cell is coupled to a second access line while the first signal is asserted;
        the first memory cell is coupled to the second access line while the second signal is asserted; and
        the write duty cycle and the read duty cycle are different.

18. The method of claim 17, wherein:
    asserting the first signal comprises generating a first pulse on the access line, the first pulse having a first duration influenced by an optimal write duty cycle selected from a plurality of possible duty cycles; and
    asserting the second signal comprises generating a second pulse on the access line, the second pulse having a second duration influenced by an optimal read duty cycle selected from the plurality of possible duty cycles.

19. The method of claim 17, further comprising identifying an optimal duty cycle combination of a plurality of possible duty cycle combinations for accessing the first memory cell, the optimal duty cycle combination including the write duty cycle and the read duty cycle.

20. The method of claim 19, wherein identifying the optimal duty cycle combination comprises:
    determining a respective maximum operating frequency for each respective duty cycle combination of the plurality of possible duty cycle combinations resulting in a plurality of maximum operating frequencies;
    identifying a greatest maximum operating frequency of the plurality of maximum operating frequencies; and
    identifying the respective duty cycle combination associated with the greatest maximum operating frequency.

* * * * *